United States Patent [19]

Selfridge et al.

[11] Patent Number: 5,680,530

[45] Date of Patent: Oct. 21, 1997

[54] GRAPHICAL ENVIRONMENT FOR INTERACTIVELY SPECIFYING A TARGET SYSTEM

[75] Inventors: Peter Gilman Selfridge, Cranford; Loren Gilbert Terveen, Basking Ridge, both of N.J.

[73] Assignee: Lucent Technologies Inc., Murray Hill, N.J.

[21] Appl. No.: 308,250

[22] Filed: Sep. 19, 1994

[51] Int. Cl.$^6$ .................................................. G06T 11/00
[52] U.S. Cl. .......................................... 395/140; 395/335
[58] Field of Search ................................. 395/500, 650, 395/700, 140, 155–161, 326, 333–335, 356, 357

[56] References Cited

U.S. PATENT DOCUMENTS

| | | | |
|---|---|---|---|
| 5,187,788 | 2/1993 | Marmelstein | 395/700 |
| 5,241,580 | 8/1993 | Babson, III | 379/15 |
| 5,257,363 | 10/1993 | Shapiro et al. | 395/500 |
| 5,278,951 | 1/1994 | Camacho et al. | 395/140 |
| 5,283,896 | 2/1994 | Temmyo et al. | 395/650 |
| 5,323,452 | 6/1994 | Dickman et al. | 379/201 |

FOREIGN PATENT DOCUMENTS

92 11602  7/1992  WIPO .......................... G06F 15/62

OTHER PUBLICATIONS

"A Browser for Directed Graphs", L. A. Rowe, et al., *Software–Practice and Experience*, vol. 17(1), Jan. 1987, pp. 61–76.

"The PIONS Graphics System", J. Bettels et al., *IEEE Computer Graphics and Applications*, Jul. 1986, USA, vol. 6, No. 7, ISSN 0272-1716. pp. 30–38.

"Knowledge–based Editors for Directed Graphs", W.F. Tichy et al., *ESEC '87: 1st European Software Engineering Conference.* Proceedings, Strasbourg, France, 9–11 Sep. 1987, ISBN 3-540-18712-X, 1987, Berlin, West Germany, Springer–Verlag, West Germany, pp. 101–109.

"Libgraph–abstract graph library", LIBGRAPH MAN page.

S. C. North, K.-P. Vo, "Dictionary and Graph Libraries", *1993 Winter USENIX*, Jan. 25–29, 1993, San Diego, CA.

L. G. Terveen, "Intelligent Systems as Cooperative Systems", *Int'l. Journal of Intelligent Systems*, 1993.

W. Mark, S. Tyler, J. McGuire, J. Schlossberg, "Commitment–Based Software Development", *IEEE Transaction on Software Engineering*, 1992.

S. G. Eick, "Graphically Displaying Text", *Journal of Computational and Graphical Statistics*, 1994.

(List continued on next page.)

*Primary Examiner*—Almis R. Jankus
*Attorney, Agent, or Firm*—G. E. Nelson

[57] ABSTRACT

Apparatus for constructing a complex artifact out of primitive artifacts and other complex artifacts. The apparatus has a permanent knowledge base of primitive artifacts, previously-made complex artifacts, and rules defining how complex artifacts are made from primitive artifacts. All artifacts in the permanent knowledge base have been checked for consistency. Artifacts from the permanent knowledge base are displayed in a search area as directed graphs in which the artifacts are represented by nodes. A user may search the permanent knowledge base, and the directed graphs in the search area show the results of the search. To construct a new complex artifact or to add to a complex artifact under construction, the user selects nodes of the directed graphs which represent desired component artifacts. Information about the desired artifacts is copied from the permanent knowledge base to a working knowledge base and a directed graph of the contents of the working knowledge base is displayed in a work area. When information is added to the working knowledge base, consistency checks are made using the rules and the information in the permanent knowledge base. The results of the consistency checks appear in the display in the work area. A user may store an artifact under construction in the permanent knowledge base. A mapping editor permits the user to determine how object artifacts are mapped to the displays of the directed graphs.

24 Claims, 7 Drawing Sheets

OTHER PUBLICATIONS

G. Fischer, J. Grudin, A. Lemke, R. McCall, J. Ostwald, B. Reeves, F. Shipman, "Supporting Indirect, Collaborative Design with Integrated Knowledge–Based Design Environments", *Journal Human–Computer Interaction*, 1992.

M. Stolze, "Visual Critiquing in Domain Oriented Design Environments: Showing the Right Thing at the Right Place", *Proc. of Artificial Intelligence in Design*, 1994.

D. A. Wroblewski, T. P. McCandless, W. C. Hill, "DETENTE: Practical Support for Practical Action" *Proc. of CHI '91*, 195–202, 1991.

G. Fischer, "Domain–Oriented Design Environments", *Automated Software Engineering*, 1, 177–203 (1994).

B. Reeves and F. Shipman, "Supporting Communications Between Designers with Artifact–Centered Evolving Information Spaces", *CSCW '92*.

Publication Date of "Artificial Intelligence in Design" Jul. 19, 1994.

| USER ACTION | INFERENCE TYPE | SPECIFIC RULES |
|---|---|---|
| Add(X) | Group ⟹ Member | if X is an application, then add its basic features as necessary, and create all necessary justifications<br>if X is a feature cluster, then add its features as necessary, and create all necessary justifications |
|  | Class ⟹ Default Member Dependency Maintenance | if X is a feature, then add its default bound feature<br>if X is a feature, then<br>  for all features Y such that X requires Y,<br>    add Y to the delivery if necessary, and<br>    create the proper justification for Y<br>if X is a feature, then<br>  for all features Y such that X is inconsistent with Y,<br>    if Y is in the delivery, then<br>    create an inconsistency link between X and Y |
| Delete(X) | Dependency Maintenance | Verify that X can be deleted,<br>  i.e., that it is neither required by another feature in the delivery<br>  nor a basic feature of an application being delivered<br>if X requires Y (Y in the delivery), then<br>  if there does not exist X' in the delivery such that X' requires Y,<br>    then mark Y as unsupported (leaving it up to user<br>    to determine whether Y still needs to be in the delivery)<br>if X is inconsistent with Y (Y in the delivery), then<br>  if there does not exist X' in the delivery<br>  such that X' is inconsistent with Y,<br>    then restore Y's previous status |
|  | Status Update |  |

GRAPHICAL ENVIRONMENT FOR INTERACTIVELY SPECIFYING A TARGET SYSTEM

1 BACKGROUND OF THE INVENTION

1.1 Field of the Invention

The invention is directed generally to the area of automated support for collaborative work and more specifically to support for the task of producing a custom system from preexisting components.

1.2 Description of the Prior Art

For a general discussion of automated support for collaborative work, see L. G. Terveen, "An Overview of Human-Computer Collaboration", *Knowledge Based Systems, Special Issue on Human-Computer Collaboration,* 1995. Three approaches to such support can be distinguished: Activity-based approaches are based on an explicit, computational representation of a work group's activities, including actions that must be performed, relationships between actions, and commitments of actions. Computational support systems use these activity representations to manage the structure of cooperative work, e.g., by monitoring progress toward completion, issuing reminders, and indicating legal actions at a given point. Descriptions of such approaches may be found in Flores, F., Graves, M., Hartfield, B., and Winograd, T. "Computer Systems and the Design of Organizational Interaction", *ACM Transactions on Office Information Systems,* 6,2 (1988), 153–172; Kaplan, S. M., Tolon, W. J., Bogia, D. P., and Bignoli, C. "Flexible, Active Support for Collaborative Work with ConversationBuilder", *In Proc. of CSCW'92,* ACM, New York, 1992, pp. 378–385; or Medina-Mora, R., Winograd, T., Flores, R., and Flores, F. "The Action Workflow Approach to Workflow Management Technology", In *Proc. of CSCW'92,* ACM, New York, 1992, pp. 281–288.

Artifact-based approaches organize collaboration around the artifacts, or work products, that are created and manipulated as part of a group's work and the rules that govern their construction and use. Descriptions of such approaches may be found in Fischer, G., Grudin, J., Lemke, A. C., McCall, R., Ostwald. J., Reeves, B. N., and Shipman, F. "Supporting Indirect, Collaborative Design with Integrated Knowledge-Based Design Environments", *Human Computer Interaction,* 7 (1992); Reeves, B. and Shipman, F. "Supporting Communication between Designers with Artifact-Centered Evolving Information Spaces", In *Proc. of CSCW'92,* ACM, New York, 1992, pp. 394–401; or Wroblewski, D. A., Hill, W. C., McCandless, T. "DETENTE: Practical Support for Practical Action", In *Proc. of CHI'91,* ACM, New York, 1991, pp. 195–202. In such systems, activities are not represented explicitly, since the situated nature of "practical action" makes it impossible to predict accurately the course of work a priori. Computational support systems impose little or no set activity structure, instead mediating forms of collaboration organized around work products, e.g., managing access to component and artifact libraries and providing tools for creating, using, and sharing artifacts.

Toolkit-based approaches, finally, provide toolkits from which the user can construct whatever kind of collaborative system is desired.

The best known activity-based approach is the language/action perspective of Winograd, Flores, and colleagues, which resulted in The Coordinator and subsequent systems. These systems analyze common types of actions such as requests, promises, offers, and counteroffers, and identify the patterns of commitments that bind these actions together. They then design systems that enable work groups to make their actions and commitments explicit and help to manage them.

One example of the toolkit-based approach is the Oval system of Tom Malone and colleagues, described at Malone, T. W., Lai, K. Y., and Fry, C. "Experiments with Oval: A Radically Tailorable Tool for Collaborative Work", In *Proc. of CSCW'92,* ACM, New York, 1992, pp. 289–297. Oval has been used to implement four collaborative systems: the Coordinator and three artifact-based systems, gIBIS, Lotus Notes, and Information Lens. The two key aspects of Oval that permit this flexibility are its representational foundation of semistructured objects and its rule mechanism. Oval permits creation of objects to represent anything of relevance, including activities, and rules can be stated to define how the objects are to be processed. Another example of a toolkit-based approach is ConversationBuilder, described in Kaplan, S. M., Tolon, W. J., Bogia, D. P., and Bignoli, C. "Flexible, Active Support for Collaborative Work with ConversationBuilder", In *Proc. of CSCW'92,* ACM, New York, 1992, pp. 378–385. ConversationBuilder is in the language/action tradition and also appears to support synchronous collaboration.

Artifact-based systems include the domain oriented design environments developed by Gerhard Fischer and colleagues at the University of Colorado and described in Fischer, supra. These systems concentrate on asynchronous, artifact-based collaboration and on integrating intelligent design assistance and collaboration support into the environment in which users construct their artifacts. They also provide ways for systems to evolve over time, through use, presenting a "seed+evolution+re-seeding" model.

Another example of such a system is the COMET system of Mark and colleagues at Lockheed. COMET is based on the idea of commitment-based design. Design consists of reuse–specialization and modification–of existing design modules, with a goal of guiding current design decisions on the basis of previous decisions, thus requiring minimal changes to existing modules. The commitments of a module are the constraints that must be satisfied for it to be included in a design. The design process is highly interactive: designers locate a module that is "close" to what they need and specify changes to modules as necessary (using a restricted design language), the system retrieves existing modules that satisfy the modified description, and the designer then incorporates modules into the design, with the system assisting in satisfying commitments of all modules. For details, see W. Mark, S. Tyler, J. McGuire, J. Schlossberg, "Commitment-Based Software Development", *IEEE Transactions on Software Engineering,* 1992.

Though these artifact-based systems represent significant advances, user interfaces to such systems remain a problem. First, users need to be able to see the information about the artifacts which they need in a display. Visualization of information about the artifacts needs to be improved, and at the same time, the relationship between the visualization and the information must be made more flexible. Second, the users must be able to easily search large and complex spaces for artifacts. Third, users need immediate visual feedback on the results of changes in an artifact under construction. Fourth, they need better ways of keeping track of problems and pending issues as they construct a new artifact.

2 SUMMARY OF THE INVENTION

The artifact-based system disclosed herein solves these problems by providing the user with improved visualization of information about artifacts, by integrating visualization and search with artifact construction, by providing system dependency maintenance with immediate visual feedback, and by providing the user with a system for tailoring the visualization so that it displays the information needed by the user in the fashion desired by the user.

The artifact-based system disclosed herein is used to construct complex systems out of preexisting artifacts which may themselves be complex systems. The system includes a permanent data base of all available preexisting artifacts and a set of rules which define relationships between artifacts. A user of the artifact-based system has a display with two display areas; one displays graphs representing preexisting artifacts; the other shows graphs representing the artifacts presently included in the system being constructed. To produce the first graph, the user searches the permanent data base for artifacts of the kinds needed to construct the system; the results of the search are displayed in the area for preexisting artifacts.

To add an artifact to the system being constructed, the user selects an artifact in the graph in the first display area; a graph representing the selected artifact is then added to the graph in the second area. If the rules indicate that the added artifact requires other artifacts, those artifacts are automatically added to the graph as well. If the rules indicate that any addition to the graph in the second area is not compatible with what was already there, the incompatible portions of the graph are indicated in the display. When system construction is finished, the user can add the new system to the permanent data base.

Visual aspects of the graph such as node shape, color, line width, pattern, and font types are used to represent attributes of the artifacts in the graph. The flexibility of the system is increased by a mapping editor which permits a user to map an attribute to a visual aspect such as node color and to further map values of the attribute to values of the visual aspect.

Other objects and advantages of the apparatus and methods disclosed herein will be apparent to those of ordinary skill in the art upon perusal of the following Drawing and Detailed Description, wherein:

3 BRIEF DESCRIPTION OF THE DRAWINGS

FIG. 6 is a table showing the inferences employed to detect dependencies and inconsistencies in a preferred embodiment;

Figure 1:
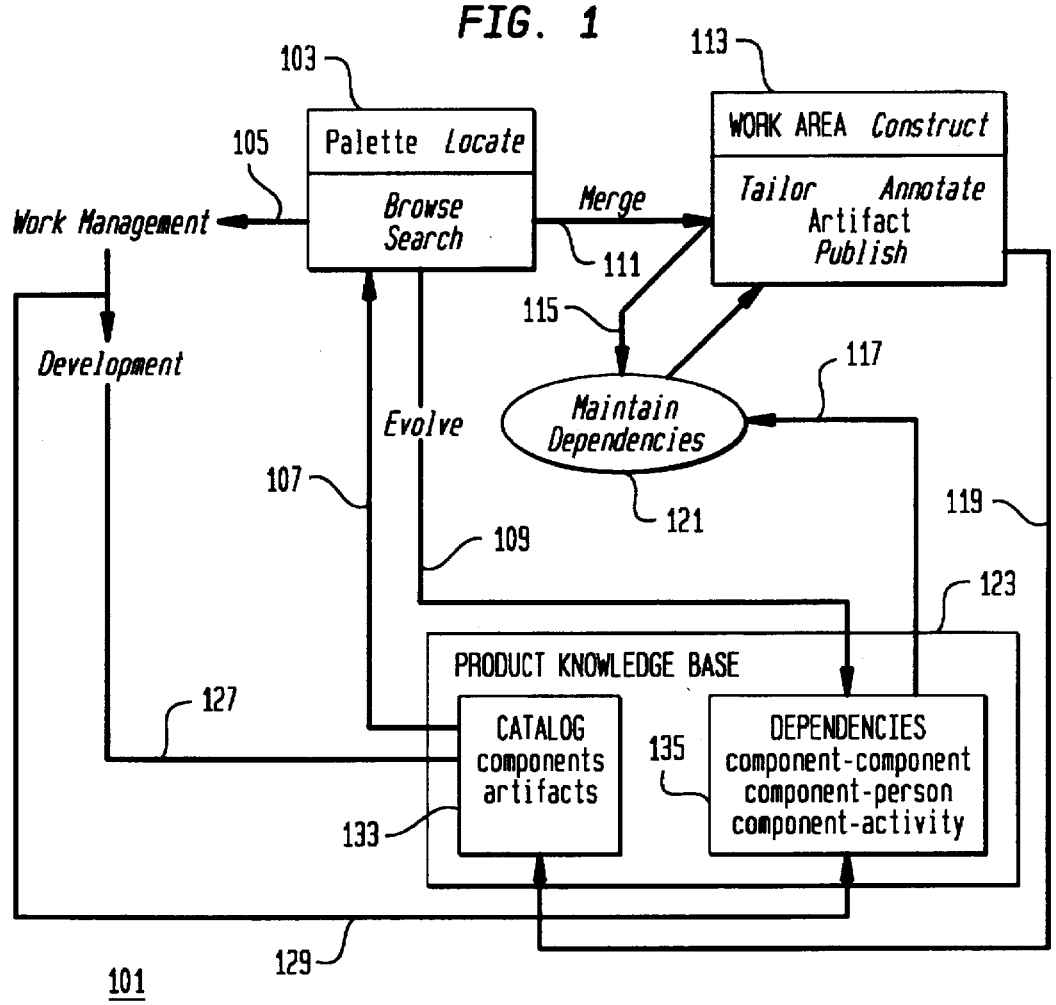
FIG. 1 is a diagram of the model of artifact construction which underlies the invention.

Reference numbers in the Drawing have two parts: the two least-significant digits are the number of an item in a figure; the remaining digits are the number of the figure in which the item first appears. Thus, an item with the reference number 201 first appears in FIG. 2.

4 DETAILED DESCRIPTION OF A PREFERRED EMBODIMENT

The following Detailed Description first presents the model of artifact construction which underlies the system of the preferred embodiment, and then provides an overview of the preferred embodiment. Next, a detailed explanation is given of a version of the preferred embodiment which is used to specify sets of features for an electronic telephone switch, and finally, details of the implementation of the preferred embodiment are provided. The preferred embodiment also includes tools for modifying the displays produced by the preferred embodiment; these, too, are explained in overview and in detail.

Model of Artifact Construction: FIG. 1

FIG. 1 shows our model 101 of artifact construction. It is a prescriptive model that identifies central tasks that need support and appropriate roles for a support system to play. In FIG. 1, square boxes represent system components and the oval represents a system task; arrows indicate flows of information.

Our work has focused on three tasks: locating objects that satisfy customer requirements, constructing an artifact from located components, and maintaining dependencies as artifacts are constructed. While the model specifies a role for work management and development (arrows 105, 127, and 129)—if no component can be located that satisfies a requirement, a work request will be created that describes the requirement, leading eventually to development of a satisfying component—our current system does not support these tasks, so we will not discuss them as we explain the model.

The model specifies a role for the system to play in supporting each task. The components of the model include a palette 103 from which artifacts may be selected, a work area 113 where a system under construction may be assembled, and a product knowledge base 131 which contains information 133 about the artifacts specified in palette 102 and information 135 about dependencies among the artifacts. We step through model 101, explaining each task briefly.

The concept of a "palette" is well known in construction kits, from commercial drawing tools to research systems. A palette makes the basic components of a domain available to users, often as a list of icons in a window, enabling them to locate components that satisfy their requirements. While our model does not commit to a specific presentation method, we note that both browsing the components directly and searching the space by specifying a description should be supported. In addition, with a large and growing product knowledge base 131, it is highly unlikely that all dependencies ever will be known. While browsing knowledge base 131, users may realize that some of the information presented is out of date; they should be supported in evolving the knowledge base to make it current (arrow 121).

When objects are located that satisfy customer requirements, they must be merged into the evolving artifact contained in the system work area (arrow 111). As objects are added, the system maintains dependencies between domain objects to ensure that the artifact remains complete and consistent, as shown by system task 117 and arrows 115 and 123). It may be necessary for users to tailor objects through non-programming modifications such as filling out a form. Users may want to annotate the artifact to include information raging from simple notes to structured rationale. When an artifact has been completed, a user must be able to publish it, i.e., add it to product knowledge base 131 (arrow 119).

Managing dependencies is the essence of cooperative work; therefore, we briefly discuss the type of dependencies our model specifies. The most basic type of dependency is between components, e.g., one component may be incompatible with a second component and may require a third. A second type of dependency is of components on people. For example, components may have "owners" who must approve all modifications. Ownership information will be useful for users who are constructing an artifact. They will need it they want to modify a component, and they may also want to select components on the basis of the owner's reputation (a form of social filtering). Finally, knowledge of scheduled activities associated with a component, e.g., maintenance or new development work, may be necessary in determining whether the component will be ready when the system must be complete.

Figure 2:
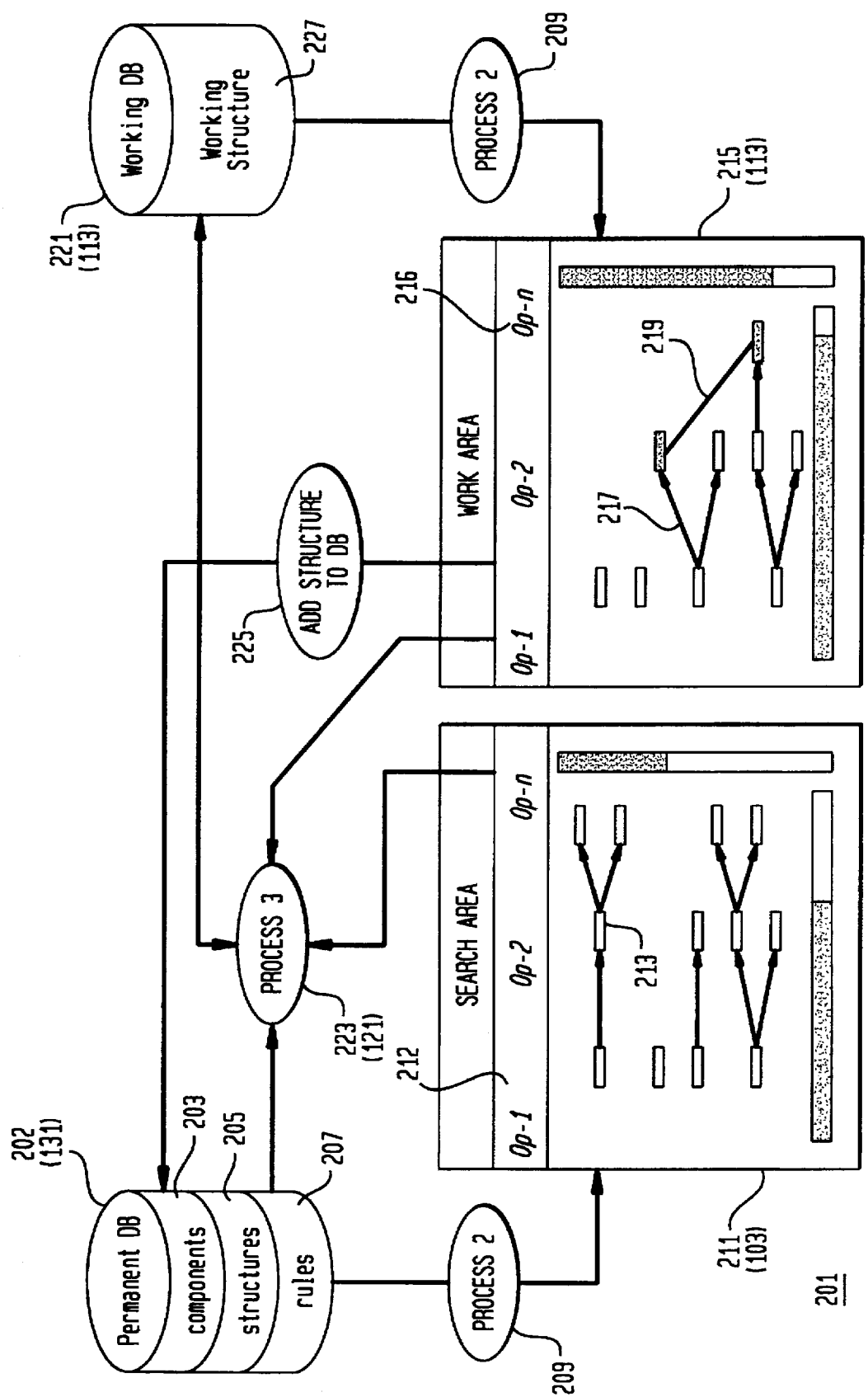
FIG. 2 is a high-level block diagram of a preferred embodiment.

Overview of the Preferred Embodiment: FIG. 2

FIG. 2 is a high-level block diagram of a preferred embodiment. Artifact construction system 201 may be implemented in any computer system which includes components for storing a permanent data base of information, components for producing a graphical display, components for receiving interactive user input, and processing components for responding to information in the data base and user inputs to produce graphical displays and to modify the data base.

FIG. 2 shows the main components and overall information flow of artifact construction system 201. The architecture consists of two databases 202 and 221, two main display windows 211 and 215, and two main processing components 209 and 223. Arrows show flows of information. Numbers in parenthesis refer to corresponding components of FIG. 1.

Permanent database 202 contains long-term information about a particular domain. It includes at least three types of information:

components 203: These are the "primitive artifacts" of the domain for which systems are being assembled;

structures 205: These are "composite artifacts" of the domain;

rules 207: The rules define how "legal" structures may be constructed from the set of components. For example, if two incompatible components are added to a structure, a rule will mark the incompatibility. If one of these components is later deleted, another rule will remove the incompatibility. If one component is added to a structure that requires a second component, that component will be added automatically. All structures 205 in data base 202 have been checked for legality. Any illegalities are noted in data base 202.

Working data base 221 contains a working structure 227 which represents the system currently under construction. Search area 211 is a display window that presents a visualization of the contents of permanent DB 202. Processing component 2 209 computes the visualization. Users search data base 202 for components or structures that they want to add to the working structure. Users can invoke various operations here that filter the information to be displayed and how it is displayed. When the search is finished, graphs 213 representing the components or structures found by the search appear in search area 211.

When a user wishes to add a component or structure to working structure 211, he or she so indicates and selects the graph representing the component or structure from search area 211. This triggers processing component 3 223, which applies rules 207 to guarantee that all of the necessary components or structures have been added to working structure 227 to detect conflicts between the added components and the original components.

Work area 215 is a display window that displays graphs 217 which represent the contents of working DB 221. Processing component 2 209 again computes the visualization. Users can invoke various operations (represented by buttons 216) on the contents of Work Area 215. Some tailor the display of the information presented. Others also modify the information in Working Structure 227, which again triggers process 3 223, which applies rules that guarantee the legality of working structure 227 as it changes.

Overview of Operation of the Preferred Embodiment

Artifact construction system 201 is typically used where systems are "custom" made to a customer's specification by combining artifacts from a set of standard artifacts. The set of standard artifacts is contained in permanent data base 202. The first task of the user of system 201 is to determine what is available in permanent data base 202. The user does this by searching or browsing components 203 and structures 205 in data base 202. The data structures which represent the components or structures which are found by the search or browsing operations are provided to processing component 2 209, which generates graphs 213 representing the components and structures in search area 211. The user controls the searching and/or browsing by mouse-activated "buttons" 212 which specify the operations and menus which appear when the buttons are selected.

When the user finds an artifact in search area 211 which he or she wants to include in the system under construction, he uses a pointing device such as a mouse to select the node representing the artifact in search area 211 and activates a button 212 which specifies that the artifact represented by the selected node is to be included in the system under construction. When that is done, nodes for the artifacts represented by the selected node and any artifact required for that artifact are added to graph 217 in work area 215.

Processing component 3 223 of system 201 responds to the addition of the selected graph 213 to work area 215 by using rules 207 in data base 202 to determine whether whether any other artifacts are required by that artifact and added artifacts are compatible with the artifacts already in the system. If other artifacts are required, they are automatically added. If inconsistencies result, graph 217 representing the artifacts in work area 215 is modified as shown at 219 to indicate which artifacts are affected by the incompatibility. The user may then delete artifacts as required to resolve the incompatibility. If the deletion remedies the incompatibility, the display ceases to indicate it. The system also does consistency checking to determine what other artifacts are no longer needed if a given artifact is removed. The display shows these unnecessary nodes and the user may then delete or retain the artifacts represented by the nodes.

When the user is satisfied with the system in work area 215, the user may indicate that he or she wishes to store the system in permanent data base 202. This is done by processing component 225. In data base 202, the system becomes a structure 205 like any other and may be searched for and used to produce other systems. As before, modification of the system represented by the graph in work area 215 and storing the system is controlled by buttons 216 and by inputs from a pointing device.

An Application of System 201

A preferred embodiment of system 201 has been used experimentally to customize a large electronic telephone switch, the 5ESS(TM), manufactured by AT&T Corp, according to customer specifications.

In this application, the primitive artifacts which are combined to customize the switch are features. The feature is a central concept in telecommunications. Call forwarding, call waiting, and conference calling are well-known features that are offered to consumers. Other features, such as line testing or service observation, are used by telephone operating companies to help manage the operation of their network. Features can be viewed as abstractions implemented in software that offer customers coherent units of functionality. Features play a central role in all aspects of the business of manufacturing the 5ESS switch, i.e., development and testing are organized around the creation, extension, maintenance, packaging, and testing of features. Development, testing, and other related tasks all are intrinsically complex. In addition, rapid growth in the number of purchasers of the switch and the diversity of their requirements has led to a corresponding increase in the number and type of features. In turn, the limits of the system and processes for managing feature information are being reached, making it more and more difficult to respond quickly and accurately to customer requests for new combinations of features.

Figure 4:
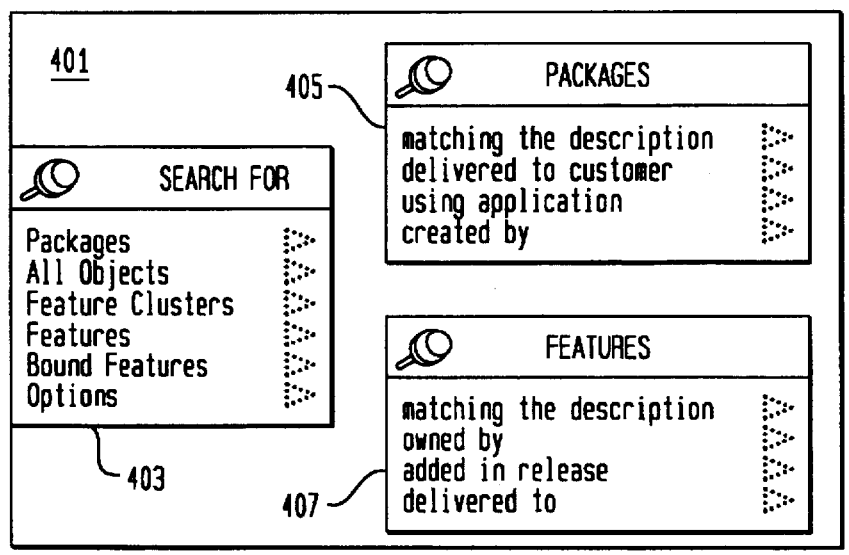
FIG. 4 is a detail of search menus used in a preferred embodiment.
Figure 3:
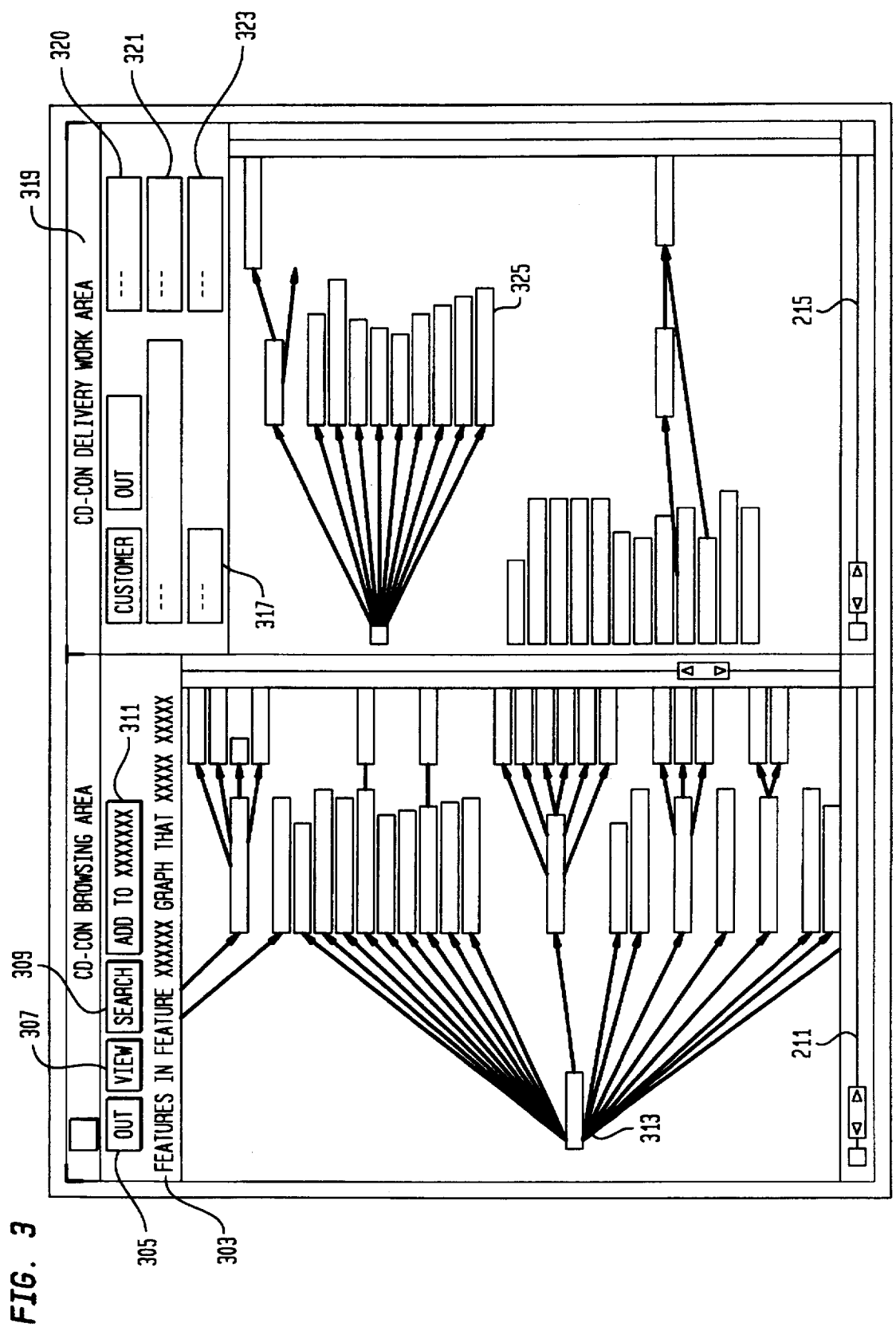
FIG. 3 is an illustration of the main display in a preferred embodiment.
Figure 5:
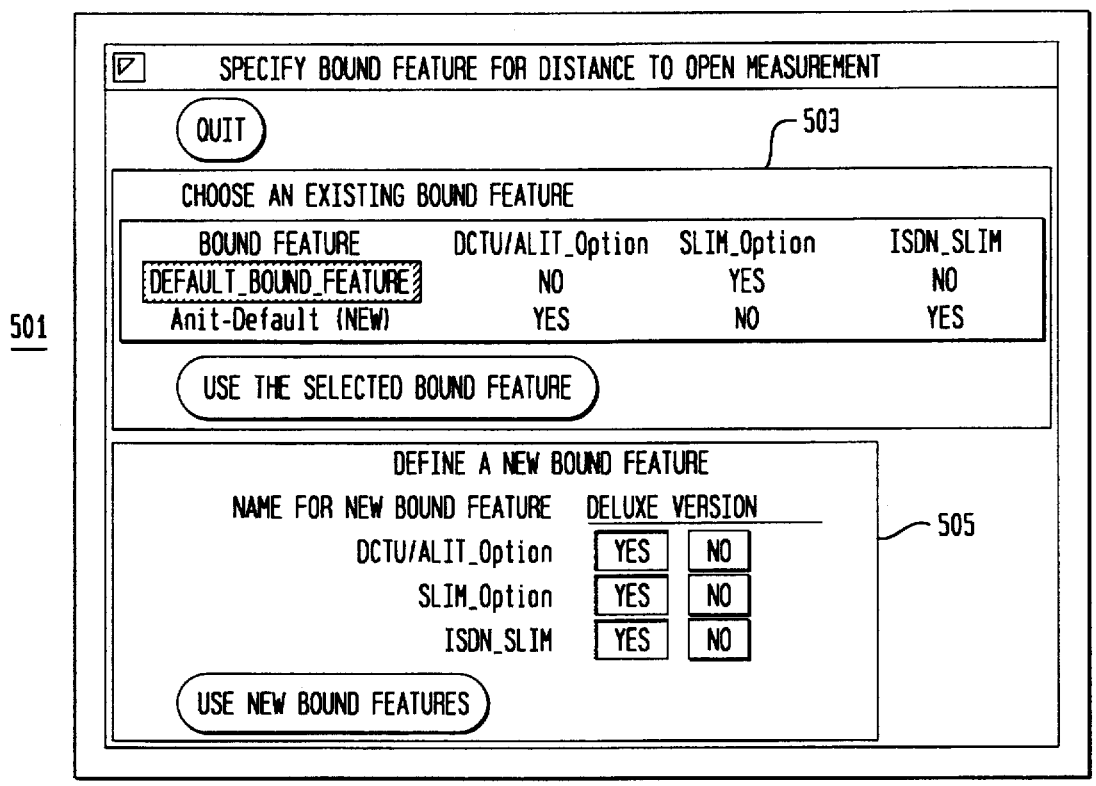
FIG. 5 is a menu used to specify bindings for options for features in a preferred embodiment.

Those who work with features employ the following special terminology:

customer delivery: a set of bound features packaged together for delivery to some customer.

feature: the fundamental unit of customer functionality feature cluster: a group of functionally related features option: a choice that determines how a feature will operate setting: a possible value for an option; options always have a default setting bound feature: a feature with settings for all its options that has been tested and delivered work item: piece of development work required to modify or create a feature dependency: constraints between features, options, and settings application: a particular way the 5ESS switch may be used Using Artifact Construction System 201 to Specify Customer Deliveries: FIGS. 3-5

When artifact construction system 201 is used to specify customer deliveries of features for the 5ESS, artifacts from permanent data base 202 are displayed in search area 211 as directed graphs. The system permits the retrieved artifacts to be viewed in three ways: The most common view (shown in FIG. 3) shows feature clusters, the features in each cluster, and the bound features and options of each feature. A second view shows applications and their basic and premium features, and a third view shows features and dependencies among features.

Objects in the graph may be selected, then manipulated by various commands, some of which apply in any of the three basic view types, others of which apply only to a particular view. Commands common to all views allow the detailed investigation of particular objects, e.g., by requesting a textual description or a table of selected attributes. A command specific to the feature-dependency view allows a user to specify a new dependency between features, thus evolving the product knowledge base.

Looking at FIG. 3 in detail, search area 211 in the preferred contains button 305, which permits the user to quit, button 307, which permits the user to select one of the three views, button 309, which indicates that the user wishes to perform a search, and button 311, which indicates that the user wishes to add a selected set of artifacts in area 211 to the product being developed in work area 215. Label 303 indicates which view is being displayed. In this case, it is features and feature clusters 313.

Because of the size and complexity of the information space, search functionality is very important. When search button 309 is pressed, a search menu appears. Selection of an option in the search menu causes another search menu to appear. The set of menus is shown in FIG. 4 The menus let users specify search patterns that are used to filter the objects that are displayed in the graph. By default, all objects that do not satisfy the search are dimmed; users also may choose to hide objects that do not satisfy the search. As shown in FIG. 4, the user may define the kind of artifact he is searching for (menu 403). Once he has done that, a menu indicating which of that kind of artifact are to be searched for appears (menu 405 and menu 407).

Examples of common types of searches include searching for objects whose descriptions match a specified phrase, features owned by a particular individual, or packages of features that were delivered to a certain customer. An important feature is that search is iterative: users can specify a series of searches, each of which applies to the results of the previous search. The system maintains data structures that record the set of objects that satisfied each search, enabling the user to "back up" to an earlier point in the search space. The "base views" (i.e., the feature cluster, application, and feature-dependency graphs) serve as starting points in the search space.

The goal of users' work in search area 212 is to locate objects to add to the Customer Delivery being constructed in work area 215; addition is done by using a pointing device to select nodes representing the desired objects and then using "Add to Delivery" button 311 to indicate that the selected objects are to be added to the customer delivery. The delivery is displayed visually as a directed graph in work area 215 of FIG. 3. When an object is added to the Customer Delivery, the system automatically maintains all dependencies involving the object. The effect for users is that as they specify objects to be added to the delivery, the system positions nodes representing the objects in the graph in work area 215, adds nodes representing other objects required by those objects, creates necessary links between the nodes representing the objects, and detects and indicates any inconsistencies.

Work Area 215: Supporting Artifact Construction

Looking at work area 215 in FIG. 3 in more detail, the graphs 325 in work area 215 are feature dependency graphs which indicate the current state of the Customer Delivery being worked on. The buttons permit the following operations:

1. adding features required for a given application to the delivery;

2. specifying that a delivery is to be added to permanent data base 202;

3. specifying bindings for a feature;

4. adding support for an an unsupported feature; and 5. deleting selected nodes.

Feature dependency graph 217 of the delivery in work area 215 contains two types of nodes—those which represent features and those which represent applications—and four types of links that represent the different types of dependencies between the features and other features and between applications and features:

a requires link connects a feature to any features it requires, an incompatible link connects two features that may not be delivered together, a basic feature link connects an application to all its basic features, and a premium feature link connects an application to all its premium features.

An important convention of the layout of Customer Delivery graph 217 is that objects added by the user always appear in the leftmost column, and the top to bottom ordering reflects the temporal ordering in which objects were added.

Work area 215 provides several additional important facilities. First, it allows users to save the current delivery as a reusable package. Information such as the customer for the delivery and the user who created it are stored with the package; in addition, the user may include textual comments. All this information will benefit other users in the future as they search for relevant packages to reuse. Second, users may load in a previous delivery, either completely replacing the current delivery, or merging it in with their work to date. Third, if no existing bound feature of a feature exactly satisfies the customer requirements, users can create new bound features easily, using a window that lists the options for the feature and the legal settings for each option. The window appears in work area 215 when button 320 is activated and is shown as window 501 in FIG. 5. The window has two parts. Part 503 indicates the values to which the feature can presently be bound and permits the user to choose one. Otherwise, the user can indicate in part 503 that he or she wishes to define a new bound value for the feature. When that is done, part 505 appears, and the user can employ part 505 to define the new bound value.

Maintaining Dependencies

System 201 uses working structure 227 and the components 203, structures 205, and rules 207 in permanent data base 202 to maintain dependencies. When a user specifies an object to be added to the delivery, the system examines the representation of that object in permanent data base 202, the representation of the delivery in working structure 227, and all dependency rules 207 that relate to the newly added object. Operations performed by the system in response to user actions include the following:

If the user specifies a feature cluster to be added, all features in the cluster are added to the delivery.

If the user specifies an application to be added, all the basic features of that application are added to the delivery.

If the user specifies a feature to be added, the system retrieves the default bound feature for that feature, and adds it instead. (Recall that bound features, not features, are delivered to customers). However, users may specify a different, non-default feature or even create a new bound feature for a feature in the delivery at any point.

Whenever a feature is added, either by user request or by system dependency maintenance, the system ensures that all required features of that feature are in the delivery, adding those that were not present already.

When an object is added, the system detects any inconsistencies between the object and other objects in the delivery.

As objects are added, "justifications" are created that record reasons why an object is in the delivery (e.g., it was added directly by a user, it is a basic or premium feature of an application, or it is a required feature of another feature). Justifications are used in determining the graph layout and deciding whether a given object may be deleted from the graph.

If the user deletes an object, the system examines the justification structures to determine the effect on remaining objects. First, deleting objects may make objects for which they were the justification "unsupported." The system advertises this fact by changing the display of these objects, but it is up to the user to decide whether to delete them or leave them in the delivery. Second, deleting an object may resolve inconsistencies, which the system also indicates visually.

To summarize, the system guarantees that the delivery is complete and that any inconsistency is noted in working structure 227 or permanent data base until it is remedied.

Object-Centered Information Delivery

A central feature of System 201 is its object-centered method of information delivery. System 201 encodes task and collaboration relevant information on the display of the work objects themselves. The goal is to let users stay on task, maintaining their engagement with their normal work objects rather than being forced to consult separate textual information or agendas of things-to-do. The object-centered approach is used both to deliver system-computed information and to allow users to tailor the object displays to focus on properties relevant to their current task.

First, as the system maintains dependencies in response to user modifications of the Customer Delivery, it may have to add objects, add relationships between objects, or modify object state information. All these changes are reflected in the visual presentation of the delivery graph, both in the configuration of objects and in display properties such as node color and background pattern, link color, and font selection.

Second, the work objects have large quantities of associated, potentially dynamic domain information, different subsets of which are relevant for different tasks. Processing component 2 209 in system 201 applies a set of default mapping rules that specify which properties of objects should be displayed and how they should be displayed. For example, in the delivery graph, inconsistent objects are colored red, and a special background pattern indicates features for which multiple bound features have been specified. Most important, an editor is provided that allows users to tailor these mappings, selecting different properties to display and/or different resources to display them.

Scenario

We next present a scenario that illustrates in detail how the functionality of system 201 supports the collaborative work involved in constructing a Customer Delivery. The details of the scenario are artificial, but both the work performed and the way the system supports it are accurate. Let us suppose that a requirements document has been received from the "New Europe Telco" company, and Tom and Kathy have been assigned to a project team headed by Linda. We will consider four stages of the group's work: first, Linda will create a basic Customer Delivery for this project; second, Kathy will build on the basic Customer Delivery to respond to the requirements she has been assigned; third, Tom will do the same; finally, Kathy will merge together their individual feature lists into a unified Customer Delivery.

1. Linda—creating the basic Customer Delivery.

Linda first specifies the customer for this delivery, "New Europe Telco". Second, she has determined that the application to be delivered (i.e., the way the switch is going to be used) is Intelligent Network, or IN, so she uses search area 215 to search through the previous Customer Deliveries stored in permanent data base 202 to find Customer Deliveries for the IN application and to browse the ones she finds. However, she does not find any that are suitable for reuse, so she simply specifies the IN application in the Delivery Work Area. When she does so, the system makes a graph in work area 215 which includes nodes representing the basic features of the IN application as well as nodes representing any features required for the basic features. In this case the feature Foreign Voltage Tests require several other features, so nodes representing those features are added automatically. Linda then saves the Customer Delivery to permanent data base 202 as "New Europe Telco 1-94 Base".

2. Kathy—responding to her assigned requirements.

Kathy begins by loading the base Customer Delivery created by Linda into work area 215. Reading her assigned requirements makes it clear to her that the customer wants ISDN service; therefore, she uses search area 211 to search for all features whose descriptions contain the string "ISDN". Graphs representing these features are displayed in search area 211 and Kathy browses them, reads descriptions for several of them, and then decides to add them all to the Customer Delivery in work area 215. However, it turns out that two of the features, Call Diversion Services and Office Traffic Flow Measurements, are inconsistent with each other. The system detects this, colors the nodes representing the two features in red, and adds a link between the nodes to indicate the inconsistency. (coloring in red is the system default way to indicate inconsistencies.) After reading the descriptions of both features, Kathy deletes Call Diversion Services from the delivery, and the system updates the display of Office Traffic Flow Measurements to show it now is consistent. Kathy then saves her work as "New Europe Telco 1-94 Kathy".

3. Tom—responding to his assigned requirements.

Tom also begins by loading in the base Customer Delivery created by Linda into work area 215. (Note that he could have loaded in and worked on Kathy's version; however, we assume that Kathy and Tom work in parallel.) Reading over the requirements reminds Tom that his group has responded to similar requirements in the past. He knows that his friend Frank was involved, so he searches for Customer Deliveries created by Frank. He finds one and the corresponding graph is displayed in search area 211 By browsing through the Customer Delivery's features he finds that several of them can be applied directly to satisfy his assigned requirements, so he selects them to be added to the base customer delivery in work area 215. When he has finished, he saves his work as "New Europe Telco 1-94 Tom".

4. Linda—created a unified Customer Delivery.

Linda begins by loading Kathy's version of the Customer Delivery into work area 215 and continues by merging Tom's customer delivery with it. As the system merges the versions, the system checks for other required features, for conflicting features, and also to determine whether Tom and Kathy have specified different bindings of options in the same feature. In this case, Tom and Kathy specified different bound features for both Service Observation and Manual Code Controls, so the system changes the background pattern for the graph nodes representing these features (again, this is the default technique). For each feature, Linda accesses the window of FIG. 5 and chooses a single bound feature for each feature, thus resolving this problem. She also notices that the graph in work area 215 indicates an inconsistency between a feature specified by Tom and one specified by Kathy. After examining these features in detail, it is not clear to her what to do about the inconsistency, so she decides to talk with Tom and Kathy. Because information about the inconsistency is retained in working structure 227 and/or permanent data base 202 and appears whenever a feature dependency graph of the delivery is displayed, she is not in danger of losing track of it. Finally, Linda wants to examine the "Retest-Only" and "Extension" lists for the delivery. The system has been computing this information throughout the construction process; however, it is not displayed by default. Linda invokes the mapping editor which maps artifact attributes onto display resources, selects the "feature list" attribute, specifies that font color should be used to distinguish the feature list each feature is on, then specifies that "Retest-Only" features should use the color white and "Extension" features should use the color green. After examining the delivery, she may generate a report that lists the features that appear on the two different feature lists. Work area 215 in FIG. 3 shows the state of the delivery at this point.

Implementation Details

The following discussion of implementation details first presents an overview of the implementation of the preferred embodiment, then describes the CLASSIC concept hierarchy used in the preferred embodiment, thereupon gives details of consistency checking in the preferred embodiment, and finally gives details of the mapping editor in the preferred embodiment.

Figure 7:
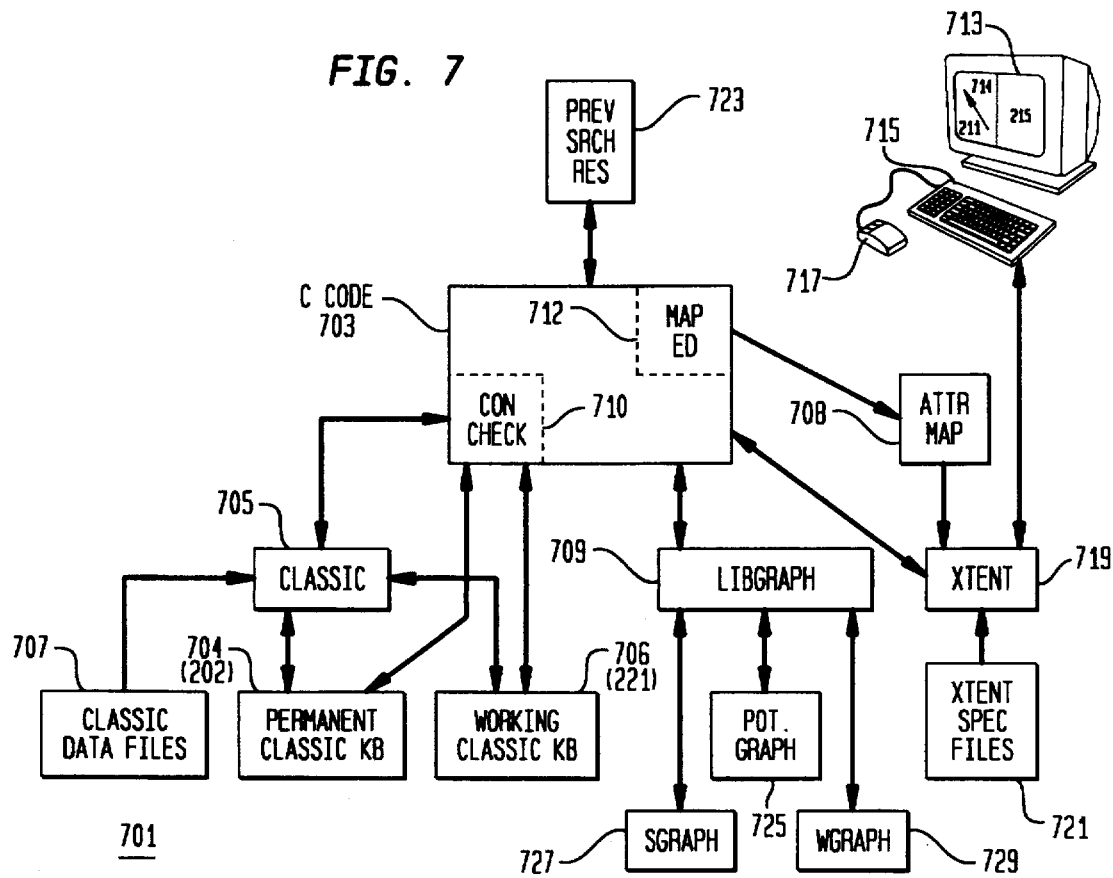
FIG. 7 is a detailed block diagram of the preferred embodiment.

Overview of the Implementation: FIG. 7

The preferred embodiment of system 201 is implemented using the C programming language and the X Windows windowing system and runs on workstations which use the UNIX operating system (UNIX is a registered trademark of X OPEN). It includes three technologies that are provided as C libraries:

CLASSIC is a flame-based representation language that includes means to represent structured objects, both general classes and specific instances, to arrange objects in a hierarchy, and several inference techniques, including simple forward-chaining rules. For details, see Brachman, R. J., McGuinness, D. L, Patel-Schneider, P. F., Resnick, L. A., and Borgida, A. "Living with CLASSIC: When and How to Use a KL-ONE-Like Language", In *Formal Aspects of Semantic Networks*, J. Sowa, Ed., Morgan-Kauffman (1990).

Xtent is an interface specification language for developing X Windows-based graphical user interfaces; for details see Blewett, D., Anderson, S., Kilduff, M., Udovic, S., Wish, M. "X Widget Based Software Tools for UNIX" In *Proc. of* 1992 *USENIX Conference,* 1992, pp. 111–123.

The libgraph graph package is used to represent and manipulate directed and undirected attributed graphs. See North, S. C. and Vo, K. P. "Dictionary and Graph Libraries". In *Winter USENIX Conference Proceedings,* 1993, pp. 1–11.

FIG. 7 shows the relationships between the components. Implementation 701 contains C code 703, which implements processing components 209, 223, and 225. The code includes invocations of library routines from CLASSIC 705, libgraph 709, and Xtent 719. The actual data for the features is maintained in CLASSIC data files 707. When implementation 201 is running, CLASSIC uses the information in CLASSIC data files 707 to make two knowledge bases in memory, permanent CLASSIC knowledge base 704, which implements permanent data base 202, and working CLASSIC knowledge base 706, which implements working data base 221.

Components of C code 703 take information from knowledge base 704 and knowledge base 706 and use library routines from libgraph 709 to produce three graphs: potential graph 725, which is a graph showing all of the objects in permanent knowledge base 704, search graph 227, which represents the graph presently being displayed in search area 211, and working graph 729, which represents the graph which corresponds to working structure 727. That graph is of course displayed in work area 215. Previous search results 723 stores lists of CLASSIC objects found in previous searches and thus permits the user to quickly redisplay the graphs resulting from those searches in search area 211.

The display of graphs in search area 211 and work area 215 and the user interaction with them and other portions of the display is handled by Xtent library routines. In X Windows, components of the display such as nodes and links of graphs and buttons are represented by widgets. The widgets control behavior of the components in display 713 and the manner in which the components respond to inputs from keyboard 715 or pointing device 717. The latter controls pointer 714 in display 713. Xtent manipulates these widgets as required by graphs 727 and 729 and inputs from the user. The Xtent library routines 719 employ Xtent specification files 721. A CLASSIC object, the corresponding node in the data structure produced by libgraph 709, and the corresponding object in display 713 are all identified by the CLASSIC object's unique identifier. Such an identifier is assigned to each CLASSIC object when the object is created.

Two special components of C code 703 which will be explained in more detail later are consistency checker 710, which performs consistency checks when a feature is added to a customer delivery, and mapping editor 712, which permits the user to edit attribute map 708.

In operation, implementation 701 first initializes itself by constructing potential graph 725 from the component and structure information in permanent CLASSIC data base 704. The user then uses mouse 717 to select a view of permanent data base 704 to be displayed in search area 211. Xtent 719 responds to this by specifying a callback routine in C-code 703 which constructs a search graph 727 for the desired view from potential graph 725 and then provides search graph 727 to Xtent 719, which generates the widgets required for the graph display using the information and attribute map 708. Each time the user specifies a new search, the search is performed in permanent CLASSIC knowledge base 704 and the result is displayed by making a new search graph 727 from potential graph 725 and providing the new search graph 727 to Xtent 719. Each time a new search is performed, the results of the previous search are stored in previous search results 723.

When the user selects a node displayed in search area 211 for inclusion in work are 215, the system responds to the selection by adding the corresponding objects from permanent classic knowledge base 704 to working CLASSIC knowledge base 706. In the course of adding objects, the necessary dependency maintenance checks are performed using routines in CLASSIC 705 and routines in C code 703. The necessary information comes from knowledge bases 704 and 706. The results of the checks are recorded in knowledge base 706. Then a working graph 729 is made from the objects in working knowledge base 706 and provided to Xtent 719 for display. Working graph 729 includes the results of the dependency maintenance checks, and hence the display of working graph 719 in work area 215 displays the results.

Deletion of a node displayed in work area 215 results in modification of working knowledge base 706 and the application of dependency maintenance checks. A new working graph 729 which reflects both the deletion and the results of the new dependency maintenance checks is made and provided to Xtent 719 for display. Finally, when the user specifies that the graph being displayed in work area 215 is to be saved to permanent CLASSIC knowledge base 704, the CLASSIC objects in working CLASSIC data base 706 are added to permanent CLASSIC data base 704. As will be explained in more detail below, the preferred embodiment employs routines in C code 703 to do part of the dependency maintenance because the necessary facilities are not available in CLASSIC.

Figure 8:
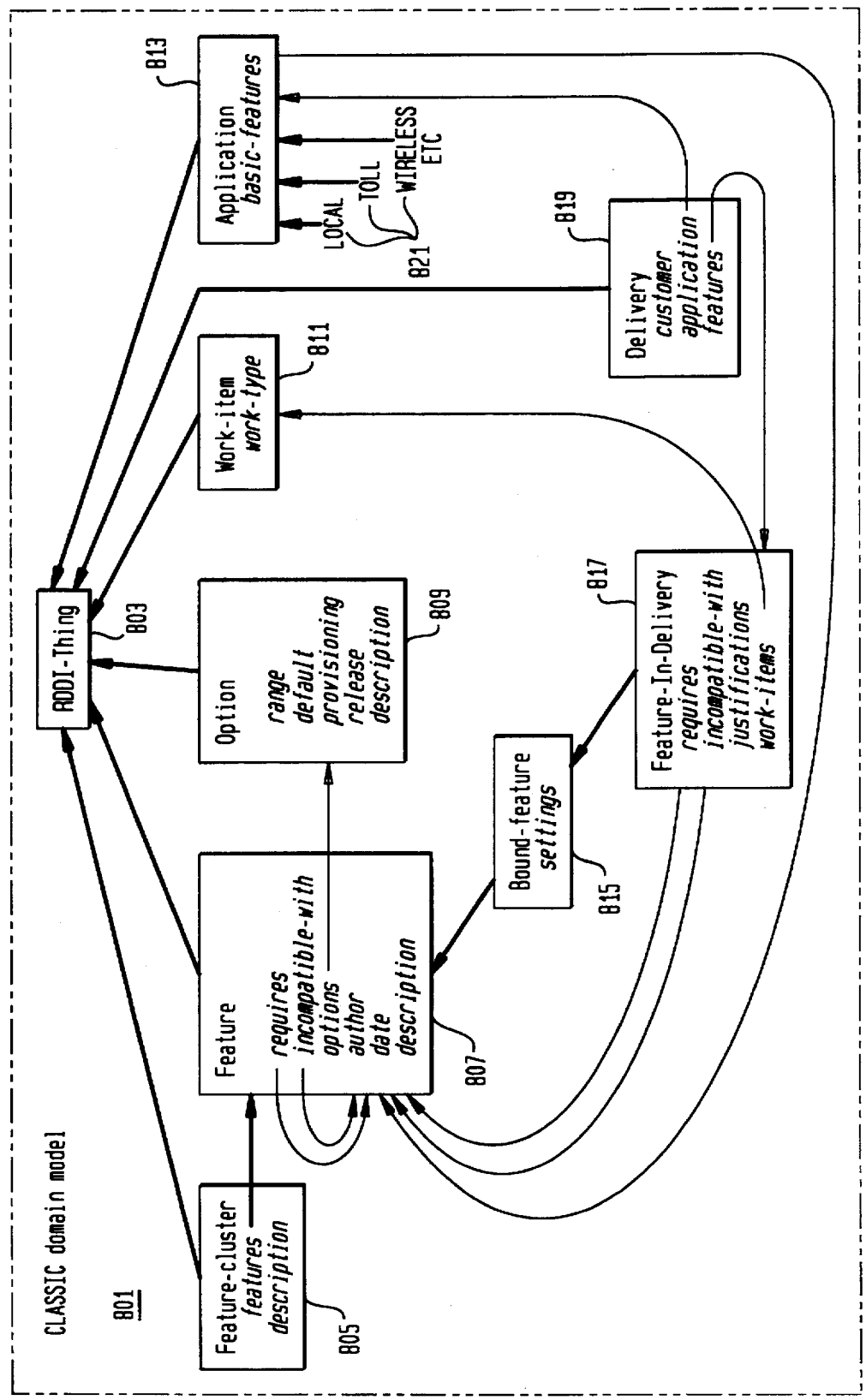
FIG. 8 is an overview of the structure of the CLASSIC knowledge base employed in the preferred embodiment.

Representing the Feature Domain in CLASSIC: FIG. 8

In a CLASSIC knowledge base, objects are ordered according to a hierarchy of concepts. All objects which belong to a concept have slots containing values. The values may be strings or numeric values, or they may be other objects. FIG. 8 shows the CLASSIC concept hierarchy used in a preferred embodiment. In FIG. 8, concepts are indicated by rectangular boxes. The name of the concept is in Roman type in the box. Heavy arrows indicate concept-subconcept relationships between concepts. A concept's slots are indicated by italic type within the boxes. If a slot requires other objects as values, there is a thin arrow from the concept to which the slot belongs to the concept for the objects which fill the slots. Individual objects are indicated by Roman type and are connected by arrows to their concepts.

The broadest concept in the hierarchy is RDDI Thing 803, to which any object which is used to produce a customer delivery belongs. The immediate subconcepts of RDDI Thing 803 are Feature-cluster 805, the concept to which feature cluster objects belong, Feature 807, the concept to which feature objects belong, Option 809, the concept to which objects which are options in features belong, Work-item 811, the concept to which objects that are presently being developed belong, Delivery 819, the concept to which delivery objects belong, and Application 811, the concept to which objects which are switch applications belong. Feature concept 807 has a Bound-feature subconcept 815 to which feature objects belong whose options are bound and Bound-feature concept 815 has a Feature-in-Delivery subconcept to which feature objects which are part of a delivery belong. FIG. 8 only shows a few objects 821, all of which are instances of Application concept 831.

Feature concept 807 can serve as an example of how slots relate objects in the CLASSIC knowledge base to each other. The requires slot in the feature object for a given feature contains a list of other feature objects which represent features required for the given feature. The incompatible-with slot contains a list of other feature objects which represent features incompatible with the given feature. The options slot contains a list of objects belonging to the option concept which specify the options for the feature. The remaining slots contain text strings with the information indicated by the slot's name.

It will be immediately apparent that objects ordered according to hierarchy 801 contain the information required for searching, for generating the displays in search area 211 and work area 216, for maintaining consistency, and for updating permanent data base 202. For example, the author and description slots in feature objects permit searching for them by author, by name, or by a keyword such as ISDN. The requires slot makes it possible to add all of the features which a given feature requires to the graph in search area 211 or the graph in work area 215 and to determine what features are unsupported when the given feature is deleted. The incompatible-with slot makes it possible to determine whether a feature is incompatible with any other feature in work area 215 when the feature is added to the work area. When an application or feature cluster object is added to permanent data base 202, all of the new feature objects specified in the slots for the application or feature cluster object are also added to permanent data base 202, and when a new feature object is added, a bound-feature object with the feature object's default option settings is also added.

Consistency Checking: FIG. 6

As pointed out above, process 3 of system 223 uses rules 207 to perform consistency checks whenever a node is added to or deleted from work area 215. These checks, which are performed in the preferred embodiment by consistency checker 710 in C code 703, are summarized in table 601 of FIG. 6. A simple example will serve to illustrate how these checks are applied. Let us suppose the feature knowledge base contains the features A, B, C, D, X, and Y and the relationships A requires B, A requires C, B requires D, X requires C, and Y inconsistent with D. We now trace through a brief scenario involving this knowledge base. We use lowercase letters to indicates default bound features, e.g., a is the default bound feature for a. "User adds feature . . ." should be understand as "User requests that feature . . . be added to the delivery".

1. User adds feature A.

The system applies the Class→Default Member inference to add a to the delivery. Since A requires B and C, the system checks to see whether bound features for B and C already exist in the delivery. Since they do not, it adds b and c, and creates requires links from a to b and a to c, and justification links from b to a and c to a. Likewise, since B requires D, the system adds d to the delivery, and creates a requires link from b to d and a justification link from d to b. When the system displays the graph, it uses italic font for b, c, and d to indicate they were added by the system.

2. Users adds feature X.

The system adds x to the delivery. Since X requires C, the system checks to see whether c is in the delivery. Since it is, the system just adds a requires link from x to c and a justification link from c to x.

3. Users adds feature Y.

The system adds y to the delivery. Since Y is inconsistent with D, the system checks to see whether d is in the delivery. Since it is, an inconsistency link is created between y and d. At this point, the the internal representation of the delivery (simplified for clarity) in working CLASSIC data base 706 would be as follows:

a—requires: b, c
   justifications: user
b—requires: d
   justifications: a
c—justifications: a, x
d—justifications: b
   inconsistencies: y
x—requires: c
   justifications: user
y—justifications: user
   inconsistencies: d The graph in work area 215 of course corresponds to the representation in working classic knowledge base 706.

4. User tries to delete d.

The system does not allow this, since d is required by b.

5. User deletes y.

The system allows this deletion, marking y as deleted. (Deletion is undoable; therefore, deleted objects remain in the internal data structure, marked appropriately.) This causes it to update d's status, marking it consistent. Finally, it updates the display representations of y and d to indicate their new status.

6. User deletes a.

The system marks a as deleted. This cause b to be marked as unsupported, since a was its sole justification. This in turn makes d unsupported, since b was its sole justification. Note however that c also was justified by x, so it retains its status. The system then updates the display representations of a, b, and d.

In our prototype, significant parts of the reasoning capabilities are implemented using the C programming language, rather than Classic. Classic was designed deliberately with limited expressive power to ensure tractability of reasoning. However, we had several requirements that Classic did not satisfy. First, we needed a default capability. Features are represented as Classic concepts (classes), but when a user requests that a feature be added to the delivery, what really must be added is the default bound feature (an instance). Second, we needed rules that would allow us to use existential quantifiers and bind variables. We need both these capabilities to state rules that describe the dependency processing that must occur when a feature F1 is added to the delivery (F1 and F2 are features, f1 and f2 are bound features that are instances of F1 and F2, respectively):

∀F2 such that F1 requires F2:
   if ∃f2∈F2 in the delivery then
      add justification from f1 to f2 else
      add default instance of F2 to delivery; call it f2
      add justification from f1 to f2

Figure 9:
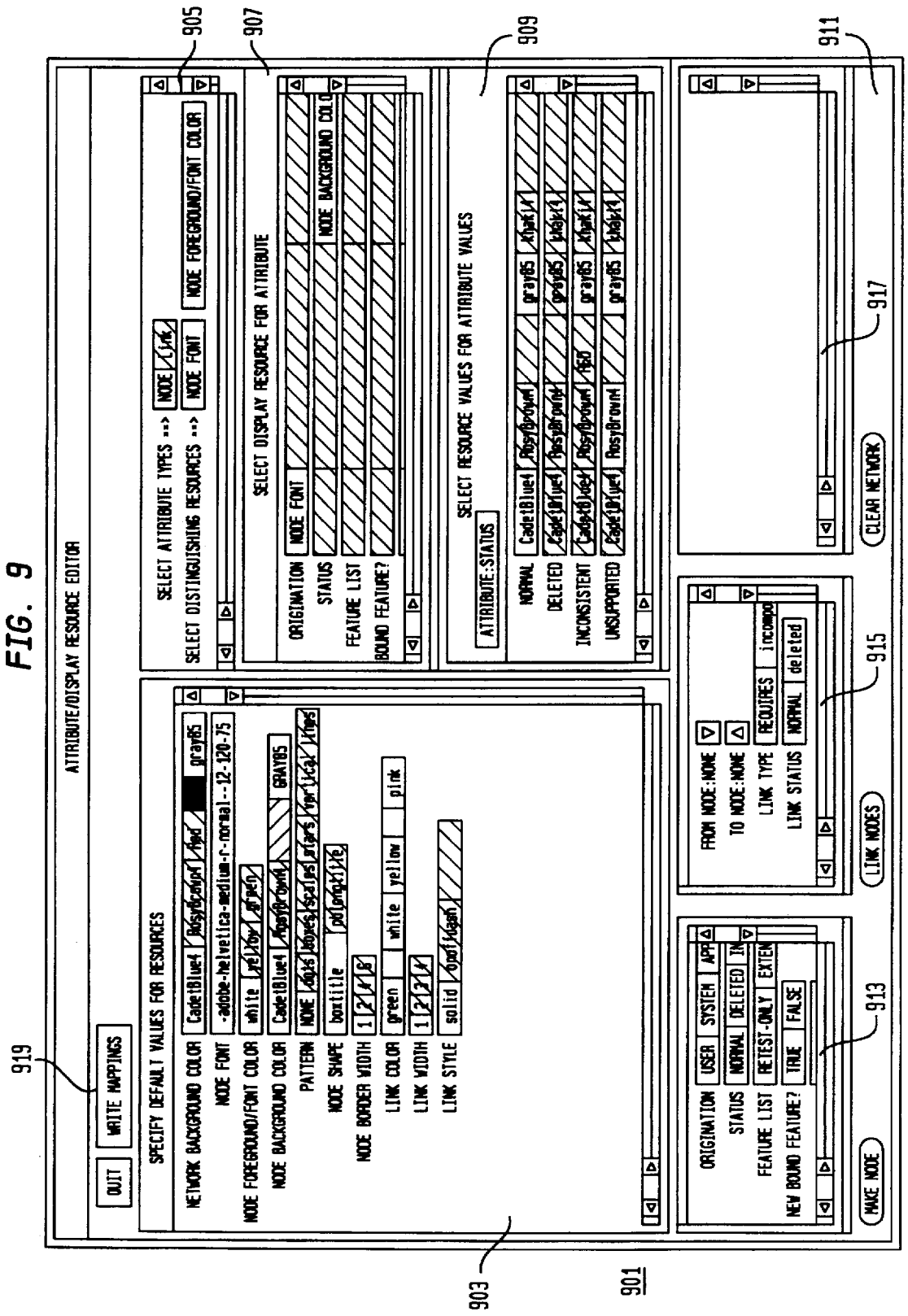
FIG. 9 is a illustration of the display used in the mapping editor of the preferred embodiment.

Mapping Editor 712: FIG. 9

As mentioned above, the nodes and links in the graphs displayed in display 713 are X Windows widgets. As such, the manner in which the nodes and links are displayed is controlled by setting resources in the widgets. In the preferred embodiment, the relevant resources for nodes are the following:

foreground and background colors and patterns;

node shapes;

fonts for labels;

line widths.

The relevant resources for links are the following:

link color link width the type of line: solid, dashed, etc.

When a widget for a node or link is created, each of the resources for the widget may be given a type specifying the kinds of values the resource may have; at creation, or later on, the resource may be set to a value of the type.

Mapping editor 712 permits a user of implementation 701 first to map attributes of the artifacts represented by the nodes to the above resources and then to determine the kinds of values the resources which have been mapped to the attributes will have and the set of such values which will be used in each of these display resources. The user can also specify the default value which a display resource will have when it is not mapped to an attribute.

In the preferred embodiment, the user can employ the mapping editor to determine how the following attributes of features appear in the display of nodes representing the features:

origination:
   the appearance of the mapped resource indicates whether the feature represented by the node is part of an application, was added by the system, or was added by the user.

status:
  the appearance of the mapped resource indicates whether the feature represented by the node node is normal, deleted, inconsistent, or unsupported;

multiple bound features:
  the appearance of the mapped resource indicates whether the feature represented by the node has multiple bindings for its options; and selected:
  the appearance of the resource indicates whether the feature represented by the node has been selected for inclusion in work area 215 or for deletion from work area 215.

The attributes which determine the appearance of the links are the following:

link type:
  the relationship between the features represented by the linked nodes, i.e., whether one of the features requires the other, whether the features are incompatible, whether the node is a basic feature in a package, or whether it is a premium feature.

link status:
  whether the link is normal or deleted.

Using the mapping editor, the user can for example first decide that the origin of a node is to be indicated by its background color and can then determine which background color represents which resource. The remaining resources either retain their default values or values determined by attributes which were previously mapped to the resources.

FIG. 9 shows the window 901 employed by a user of system 701 to map an attribute of a feature to a resource. There are three basic parts of window 901: sections 905,907, and 909 map a resource to an attribute and map values of the attribute to values of the resource. Section 908 permits the user to specify default values for unmapped resources. Section 911 permits a user to see what a node or link made using a particular set of mappings looks like.

Beginning with section 905, in that section, the user may first select whether node or link resources are being mapped and then select which of the resources are being mapped. The convention used here and throughout window 901 is that the choices are represented as horizontal lists which may be scrolled if necessary. Choices are selected from the list using the mouse. For example, the first list permits the user to select node or link resources for mapping; the user has selected node; the second list then contains the mappable node resources, and the user can select one or more of them. Here, node font, node foreground/font color, and node background color have been selected (node background color is scrolled off the list).

The selected resources then appear in section 907, which specifies the mapping of attributes to the selected resources. Section 907 has a list of the attributes on the left (again, scrollable), and for each attribute, a list of the resources selected in section 905. To map an attribute to a resource, the user employs the mouse to move the pointer to the list of resources for the attribute and selects the desired resource. Of course, a given resource can be mapped to only a single attribute. Here, the node font resource has been mapped to the origination attribute and the node background color resource has been mapped to the status attribute.

Once an attribute has been mapped to the resource, section 909 is used to map values of the attribute to values of the mapped resource. Here, this is being done for the status attribute. It has four values. In this case, the values are listed on the left and each value has a list of possible colors on the right. To select a color for a value, the user selects a color from the list.

Section 903 uses the techniques just described to select default values for resources. The list on the left shows the available resources and the list to the right of each resource shows the available values for the resource. Section 911 permits the user to preview the results of his selections in areas 905, 907, 909, and 903. Section 913 of section 911 permits a user to specify values of attributes for a feature represented by a node; section 911 permits the user to specify values of attributes for links; again, the techniques of the other sections are used for selection. The results of the attribute selections is displayed in area 917.

When the user is done making his selections and checking the results, he or she uses the mouse to activate button 919, which alters attribute map 708 as required by the selections. As will be apparent from the above discussion, attribute map 708 is implemented as a table which has an entry for each mappable attribute. The entry for the mappable attribute indicates the widget resource corresponding to the attribute, the possible values of the attribute, and the resource value corresponding to each attribute value. A separate table specifies the default resource values. When Xtent 719 makes a widget from a node of one of the graphs maintained by libgraph 709, it uses the table in attribute map 708 to set resources for the mapped attributes; the remaining resources are set as specified in the table of default resource values.

Conclusion

The foregoing Detailed Description has disclosed to those skilled in the arts to which the disclosure pertains the best mode presently known to the inventors of making and using their system for constructing a product out of artifacts. Important aspects of the inventors' system include the following:

provision of a palette which potentially includes every structure or product in a permanent data base of products;

searchability of the data base according to various aspects and presentation of the results on the palette;

the use of graphs in the palette and work areas to represent the structures;

the integration of information about the artifacts into the graphs which represent them;

the capability of editing the mappings between information about the artifacts and the display of the information in the graphs;

consistency checking when an artifact is moved from the palette to the work area and when an artifact is deleted in the work area; and the capability of adding the contents of the work area to the permanent data base.

While the inventors have disclosed the best mode known to them of implementing their system, those skilled in the art will immediately understand that many ways of implementing a system having the properties of the one disclosed herein exist. For example, the system can be implemented using programming languages other than C and operating systems other than UNIX and can be implemented on main flames or personal computers as well as work stations. Knowledge bases other than CLASSIC could be used to implement permanent data base 202 and working data base 221, and indeed, standard data bases and a separate store of rules for consistency checking could be used in the implementation instead of a knowledge base. Similarly, graph packages other than libgraph could be employed, as well as graphical user interface systems other than X Windows and X windows interfaces other than Xtent. Additionally, the mapping editor can be used to map ranges of attribute values to widget resources. Moreover, the aims of the invention can be attained by means of graphical displays and user interactions different from those disclosed herein.

All of the above being the case, the foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the law.

What is claimed is:

1. Apparatus implemented in a computer system which permits a user to define a manner of display for a graph having attributes associated with nodes and/or edges of the graph, the apparatus comprising:

a graph data structure stored in the computer system for representing the nodes and edges of the graph;

an attribute map data structure stored in the computer system for relating certain of the attributes to properties of a display of the graph;

a mapping editor executing in the computer system and responsive to inputs from the user for modifying the attribute map data structure to alter relationships between certain of the attributes and the graph display properties; and a display generator executing in the computer system and responsive to the graph data structure and the attribute map data structure for generating a graph and for outputting the generated graph to a display means in the computer system which has nodes and edges specified by the graph data structure and display properties specified by the attribute map data structure.

2. The apparatus set forth in claim 1 wherein the attribute map data structure comprises:

means for mapping a given one of the attributes to a given one of the properties of the display of the graph and means for mapping a first set of the values of the given one of the attributes to a second set of values, each of which indicates a particular appearance of the given one of the properties; and the display generator displays the given one of the properties according the mapping between a current one of the first set of values and a value of the second set of values.

3. Apparatus implemented in a computer system for interactively specifying a target system, the apparatus comprising:

means for generating a display of a graph in display means in the computer system from a representation of the graph;

a first data base accessible to the computer system which contains at least a representation of a first graph specifying combinations of primitives from which the target system may be constructed;

a second data base accessible to the computer system which contains a representation of a second graph specifying at least a portion of the target system;

a first area in the display means for displaying a first graph display generated by the means for generating a display from the representation of the first graph;

a second area in the display means for displaying a second graph display generated by the means for generating a display from the representation of the second graph;

interactive component selection means for selecting a portion of the first graph display in the first area to be added to the second data base; and means responsive to the interactive component selection means for adding portions to the representation of the second graph which correspond to the portions of the representation of the first graph which correspond to the selected portion of the first graph display.

4. The apparatus set forth in claim 3 further comprising:

interactive combination addition means for indicating that the combination represented by the second graph is to be added to the first data base; and means responsive to the interactive combination addition means for adding a representation corresponding to the second graph to the first data base.

5. The apparatus set forth in claim 3 further comprising:

a set of rules accessible to the computer system which specifies at least legal combinations of the primitives and wherein:

the display generating means is further responsive to the set of rules to indicate in the second graph display whether the second graph violates one or more of the rules.

6. The apparatus set forth in claim 5 wherein:

the display generating means is responsive to the set of rules when a portion is added to the second graph.

7. The apparatus set forth in claim 5 wherein:

the set of rules further specifies primitives that are required for legal combinations of the primitives; and the means responsive to the interactive component selection means further automatically adds additional portions to the representation of the second graph which are required for the selected portion of the first graph.

8. The apparatus set forth in claim 3 further comprising:

interactive querying means for querying the first data base to obtain the representation of the first graph and providing the representation to the means for generating a display.

9. The apparatus set forth in claim 1 or claim 2 wherein the properties of the display comprise:

one or more properties of the nodes in the display.

10. The apparatus set forth in claim 9 wherein the properties of the nodes in the display comprise:

a shape property for each node.

11. The apparatus set forth in claim 10 wherein the properties of the nodes in the display comprise:

a pattern property for each node.

12. The apparatus set forth in claim 11 wherein:

the pattern is a color.

13. The apparatus set forth in claim 10 wherein the properties of the nodes in the display comprise:

an outline property for an outline of the node in the display.

14. The apparatus set forth in claim 10 wherein the properties of the nodes in the display comprise:

a font property for a label of the node in the display.

15. The apparatus set forth in claim 11 wherein the pattern property comprises:

a foreground pattern property and a background pattern property.

16. The apparatus set forth in claim 15 wherein:
either the foreground pattern is a color or the background pattern is a color or both are colors.

17. The apparatus set forth in claim 1 or claim 2 wherein the properties of the display comprise:
one or more properties of links in the display.

18. The apparatus set forth in claim 17 wherein the properties of the links in the display comprise:
a color property of the link.

19. The apparatus set forth in claim 17 wherein the properties of the links in the display comprise:
a line property of the link.

20. The apparatus set forth in claim 19 wherein the line property of the link comprises:
a width of the line.

21. The apparatus set forth in claim 19 wherein the line property of the link comprises:
a type of the line.

22. The apparatus set forth in claim 5 or claim 6 wherein:
the display generating means is responsive to the set of rules when a portion is deleted from the second graph.

23. The apparatus set forth in any one of claims 5, 6, or 7 wherein:
the first data base and the second data base are knowledge bases, the representations of the first and second graphs being made using objects in the knowledge bases and the knowledge bases including means for making inferences concerning the objects; and
at least some of the rules of the set thereof are implemented using the means for making inferences.

24. Apparatus implemented in a computer system which permits a user to define a manner of display for a graph having attributes associated with nodes and/or edges of the graph, the apparatus comprising:

a graph data structure stored in the computer system for representing the nodes and the edges of the graph;

an attribute map data structure stored in the computer system for relating certain of the attributes to properties of a display of the graph, said attribute map data structure comprising:

means for mapping a given one of the attributes to a given one of the properties of the display of the graph, and means for mapping a first set of values of the given one of the attributes to a second set of values, each of the second set of values indicating a particular appearance of the given one of the properties;

a mapping editor executing in the computer system and responsive to inputs from the user for modifying the attribute map data structure; and a display generator executing in the computer system and responsive to the graph data structure and the attribute map data structure for displaying a graph in display means in the computer system which has nodes and edges specified by the graph data structure and display properties specified by the attribute map data structure, the display generator displaying the given one of the properties according to the mapping between a current one of the first set of values and a value of the second set of values.

* * * * *